(12) United States Patent
Kaneko et al.

(10) Patent No.: US 6,768,368 B2
(45) Date of Patent: Jul. 27, 2004

(54) LEVEL SHIFTER CIRCUIT AND SEMICONDUCTOR DEVICE INCLUDING THE SAME

(75) Inventors: Tomohiro Kaneko, Kanagawa (JP); Kazuo Tozawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/392,514

(22) Filed: Mar. 20, 2003

(65) Prior Publication Data

US 2003/0179032 A1 Sep. 25, 2003

(30) Foreign Application Priority Data

Mar. 25, 2002 (JP) ....................................... 2002-084548

(51) Int. Cl.[7] ............................................... H03L 5/00
(52) U.S. Cl. ......................... 327/333; 327/112; 326/81
(58) Field of Search ................................. 327/108, 112, 327/333, 427, 189, 581; 326/68, 81, 87, 57, 58

(56) References Cited

U.S. PATENT DOCUMENTS

| 5,834,948 | A | * | 11/1998 | Yoshizaki et al. ............ 326/81 |
| 5,892,385 | A | * | 4/1999 | Hashiguchi .................. 327/333 |
| 6,087,879 | A | * | 7/2000 | Takahashi et al. .......... 327/333 |
| 2003/0058023 | A1 | * | 3/2003 | Aoki ........................... 327/333 |

* cited by examiner

Primary Examiner—Long Nguyen
(74) Attorney, Agent, or Firm—Darryl G. Walker; Bradley T. Sako

(57) ABSTRACT

A circuit is disclosed that can output signals from different circuit blocks at a common output terminal with a smaller number of transistors than conventional approaches. When a level shifter circuit receives a high voltage level at a control terminal (2), a level shifter unit (12) is placed in the operational state to provide an output signal from a low voltage system block, and a clocked inverter (106) is placed in the non-operational state. When a level shifter circuit receives a low voltage level at a control terminal (2), a clocked inverter (106) is placed in the operational state to provide an output signal from a high voltage system block. At the same time, PMOS transistor (105) can be turned on, resulting in PMOS transistors (5) being turned off. Further, NMOS transistors (109 and 110) are turned off. This can result in an output impedance of a level shifter unit (12) being set to a high impedance state. Thus, an output from a level shifter unit (12) can have essentially no influence on an output signal of clocked inverter (106).

20 Claims, 7 Drawing Sheets

(a)

(b)

(c)

LEVEL SHIFTER CIRCUIT AND SEMICONDUCTOR DEVICE INCLUDING THE SAME

TECHNICAL FIELD

The present invention relates generally to level shifter circuits, and more particularly to a level shifter circuit in a large scale integrated circuit (LSI), having multiple circuit blocks operating at different power supply voltages, the level shifter circuit translating a signal from a lower power supply voltage to a higher power supply voltage.

BACKGROUND OF THE INVENTION

A large scale integrated circuit (LSI) can include a single integrated circuit (e.g., a chip) having one logic circuit system adapted to operate with a high voltage power source, and another logic circuit system adapted to operate with a low voltage power source. Such an LSI can include a level shifter circuit that operates with the high voltage power source. The level shifter circuit converts an output signal from the lower voltage operating circuit system to a higher level for use in the higher voltage operating circuit system and/or for output via an external pin, or the like.

In an LSI having a number of blocks adapted to operate with different voltage power sources, like that described above, power consumption can be reduced by turning off (powering down) particular voltage power sources when the corresponding blocks are not in operation. Drawbacks can arise in such arrangements when a voltage power source is turned off. In particular, when a lower voltage power source is turned off, input signals for a level shifter circuit can become indeterminate. Such indeterminate input values can result in a leakage current flowing through an inverter within a level shifter circuit. Such a leakage current results in wasteful power consumption.

One conventional approach to addressing the above problem is shown in Japanese Patent Publication 9-74348A (hereinafter JP 9-74348A). JP 9-74348A shows an arrangement in which a level shifter circuit can be placed in an off state when a low voltage power source is turned off. This can prevent a current from flowing through the level shifter circuit when a low voltage power source is in the "power-down" state, thereby reducing power consumption.

FIG. 3 is a schematic diagram of a conventional level shifter circuit having the above-mentioned power down function. In FIG. 3, a terminal 1 can be an input terminal that receives an output signal from a low voltage system circuit. A terminal 2 can be a control terminal that receives a high voltage level when a low voltage power source is on and a ground voltage level when the low power voltage source is off. A terminal 3 can be an output terminal that provides a level shifted output signal. An input signal at a terminal 1 can be received by a level shifter unit 12 directly or through an inverter 10 operating at the low voltage power source. An output signal that is level shifted by a level shifter unit 12 can be supplied to terminal 3 by an inverter 11. An inverter 11 operates at the high voltage power source.

The conventional level shifter unit 12 includes p-channel metal-oxide-semiconductor (PMOS) transistors 4 and 5 and n-channel MOS (NMOS) transistors 7 and 8. PMOS transistors 4 and 5 have source electrodes connected to a high voltage power source and gate electrodes connected in a cross-coupled fashion to their respective drains. NMOS transistors 7 and 8 have gate electrodes that receive an output of inverter 10 and terminal 1, respectively, drain electrodes connected to the drains of PMOS transistors 4 and 5, respectively, and commonly connected source electrodes. A signal obtained by level shifting can be output at the drain electrodes of commonly connected PMOS transistor 5 and NMOS transistor 8.

In order to provide sufficient drive capacity, a channel width of a PMOS transistor 5 connected to an output side of level shifter unit 12 can be larger than that of PMOS transistor 4 connected to an input side of the level shifter unit 12.

The arrangement of FIG. 3 also includes an NMOS transistor 9 having a source-drain path connected between the commonly connected sources of NMOS transistors 7 and 8 and a ground potential. When a low voltage power source is on, a terminal 2 can receive a high voltage level that is applied to a gate of NMOS transistor 9. NMOS transistor 9 can turn on and bring level shifter unit 12 into an operational state. When a low voltage power source is off, a terminal 2 can receive a low voltage level that is applied to a gate of NMOS transistor 9. NMOS transistor 9 can turn off to stop the operation of level shifter unit 12.

In addition, a PMOS transistor 6 can be included that has a source-drain path connected between the output terminal of level shifter unit 12 and a high voltage power source. PMOS transistor 6 can provide a "pull-up" operation. As noted above, when the low voltage power source is on, a terminal 2 can receive a high voltage level that is applied to a gate of PMOS transistor 6, and PMOS transistor 6 can be turned off. In contrast, when the low voltage power source is off, a terminal 2 can receive a low voltage level that is applied to a gate of PMOS transistor 6. PMOS transistor 6 can turn on, thereby pulling the output terminal of level shifter 12 to a high voltage level. The operation of inverter 11 can fix the output terminal 3 at a low level.

As has been shown above, the level shifter circuit having the power down function of FIG. 3 includes inverters 10 and 11, level shifter unit 12, NMOS transistor 9 for controlling the operation of the level shifter unit 12, and PMOS transistor 6 for pulling the level of the output terminal of the level shifter unit 12 to a high voltage level when the level shifter unit 12 is in a non-operation state. In this configuration, when a low voltage power source is off, because NMOS transistor 9 is turned off, level shifter unit 12 can be placed in a non-operation state, thereby preventing current from flowing through the level shifter unit 12. In addition, PMOS transistor 6 is turned on, causing the output of level shifter unit 12 to go to a high level, which fixes the level of output terminal 3 at a low level.

As the scale of an LSI increases, the number of terminals that are to be connected to an external circuit can also increase. Consequently, the number of pins required for external connections for an LSI can increase correspondingly. Such increases in pin count can undesirably increase LSI package size, cost, or the like. In order to avoid unduly increasing the pin count of an LSI device, specifications are proposed in which output pins are shared among multiple blocks of an LSI by a mode switching operation. For example, an LSI device may include 224 pins, but 60 such pins are shared.

In devices like that described above, which include multiple blocks operating at different voltage power source levels and shared common output terminals, a level shifter is used in an input/output (I/O) buffer. In addition, it is also desirable to provide power-down modes for such devices. In a power-down mode, a block that does not output a signal to I/O buffer can be turned off.

FIG. 4 is a block schematic diagram showing an example of an LSI configured according to the above specifications.

Referring now to FIG. 4, an LSI 400 can include a low voltage system block 401 adapted to operate with a low voltage power source (e.g., 2.5 volts), a high voltage system block 404 adapted to operate with a high voltage power source (e.g., 3.5 volts), and an I/O buffer 405 that has a level shifter circuit and a signal selector circuit. Output signals from a low voltage system block 401, output signals from a high voltage system block 404, and a power-down mode switching signal from a terminal 402 can be input to I/O buffer 405. I/O buffer 405 can output signals from high voltage system block 404 through terminals 403 when high voltage system block 404 is in operation. I/O buffer 405 can also level shift output signals from low voltage system block 401, and output the resulting level shifted signals through terminals 403 when low voltage system block 401 is in operation.

FIG. 5 is a schematic diagram showing one example of I/O buffer 405 of FIG. 4 that includes the level shifter circuit of FIG. 3. Referring to FIG. 5, a selector circuit 513 can receive a level shifted signal and high voltage signal as inputs. A level shifted signal is generated by a level shifter circuit raising the level of an output signal received from low voltage system block 401, which is adapted to operate with a low voltage power source. A high voltage signal can be an output signal from high voltage system block 404, which is adapted to operate with a high voltage power source.

In response to a control signal (which varies between a high voltage level and a ground level) received at a control terminal 2, the selector circuit 513 selects either the level shifted signal or the high voltage signal, and outputs the selected signal at terminal 503.

FIGS. 6(a) to 6(c) shows an example of a selector circuit 513. FIG. 6(a) shows a complete example of a selector circuit 513. FIG. 6(b) shows an equivalent circuit to that of FIG. 6(a) that corresponds to the application of a high electric potential to control terminal 602 so that a level shifted output signal is selected. FIG. 6(c) shows an equivalent circuit to that of FIG. 6(a) that corresponds to the application of a low (ground) electric potential to control terminal 602 so that a high voltage signal is selected.

Referring to FIG. 6(a), when a high-electric potential signal is supplied to control terminal 602, PMOS transistor 615 and NMOS transistor 618 are turned off, while PMOS transistor 612 and NMOS transistor 613 are turned on. This results in PMOS transistor 616 being essentially short-circuited between its source and drain, and the source electrode of NMOS transistor 617 being isolated from a ground potential.

As result of the above arrangement, a complementary MOS (CMOS) inverter can be formed from PMOS transistor 611 and an NMOS transistor 614. Such a CMOS inverter can invert in phase and amplify a signal received at terminal 601 to provide an output at a common drain connection point of PMOS transistor 611 and NMOS transistor 614. At this time, PMOS transistor 616 and NMOS transistor 617 are placed in a non-operation state by PMOS transistor 612 and NMOS transistor 618, thus a signal from a high voltage system block received at terminal 604 is not output.

In contrast, in a power-down mode, a low electric potential signal is supplied to control terminal 602, PMOS transistor 615 and NMOS transistor 618 are turned on, while PMOS transistor 612 and NMOS transistor 613 are turned off. This results in PMOS transistor 611 being essentially short-circuited between its source and drain, and the drain electrode of NMOS transistor 614 being isolated from an output terminal.

As result of the above arrangement, a CMOS inverter can be formed from PMOS transistor 616 and NMOS transistor 617. Such a CMOS inverter can invert in phase and amplify a signal received at terminal 604 to provide an output at a common drain connection point of PMOS transistor 616 and NMOS transistor 617. At this time, PMOS transistor 611 and NMOS transistor 614 are placed in a non-operation state by PMOS transistor 615 and NMOS transistor 613, thus a level shifted signal from a low voltage system block received at terminal 601 is not output.

FIG. 7 shows another example of an I/O buffer 405. In FIG. 7, a low voltage system inverter 710 can be connected to a non-inverted side of a level shifter unit. A clocked inverter 705 and a clocked inverter 706 can be connected to an output of level shifter unit. Clocked inverter 705 can invert a phase of an output signal of level shifter unit when a signal having a high potential is supplied to control terminal 702. In addition, a clocked inverter 706 can invert a phase of a high voltage output signal when a signal having a low potential is supplied to control terminal 702. A resulting output signal is provided as an input to high voltage system inverter 711.

In the conventional arrangement of FIG. 7, when a signal at a high electric potential is supplied to control terminal 702, a PMOS transistor 715 and an NMOS transistor 716 can be turned on, while a PMOS transistor 719 and an NMOS transistor 720 are turned off. Thus, a clocked inverter 705 can be placed in an operational state, while clocked inverter 706 can be placed in a non-operational state. In such an arrangement, a level-shifted signal, generated by level shifting a low voltage input signal IN, can be output via common output terminal 703. At the same time, a high voltage signal generated from high voltage input signal DATA can be prevented from being output.

In contrast, when a signal at a low potential is supplied to control terminal 702, a PMOS transistor 719 and an NMOS transistor 720 can be turned on, while a PMOS transistor 715 and an NMOS transistor 716 are turned off. Thus, a clocked inverter 706 can be placed in an operational state, while clocked inverter 705 can be placed in a non-operational state. In such an arrangement, a high voltage signal generated from high voltage input signal DATA can be output via common output terminal 703. At the same time, a level-shifted signal, generated by level shifting a low voltage input signal IN, can be prevented from being output.

The various conventional arrangements described above have illustrated circuits that may output signals from different blocks, operating at different power source supplies, at a common output terminal with a switching operation. In particular, in order to maintain driving capacity and to prevent a non-selected signal from interfering with a selected signal, a signal selector circuit is adopted that includes clocked inverters, or the like, that can prevent a non-selected signal from being output. However, as shown in FIGS. 6(a) and 7, such approaches require eight transistors for implementing such clocked inverters. Such a number of transistors can consume considerable circuit area.

Consequently, as the number of common output terminals within an LSI I/O buffer is increased, the resulting number of transistors required increases. Such an increase in the number of transistors increases overall circuit area. Increases in circuit area can translate directly into increases in cost.

In light of the foregoing, it would desirable to arrive at some way of reducing the number of transistors for a signal selector. In particular, it would be desirable to reduce the transistor count for a signal selector that selects an output signal from multiple output signals generated by different blocks, where such blocks operate at different power supply voltages.

It would also be desirable to provide a level shifter circuit suitable for operation with an improved signal selector, like that described above. Such a level shifter circuit can shift an output signal from a circuit system operating at a lower voltage power source, to a higher voltage level.

SUMMARY OF THE INVENTION

The present invention may include a level shifter circuit that may be used in a large scale integrated circuit (LSI) having different circuit blocks that operate with different voltage sources. Signals from the different circuit blocks can be output from a common output terminal by a mode switching operation. In an operational state, the level shifter circuit can provide an output signal at a higher voltage level in response to an input signal at a lower voltage level. In a non-operational state, a level shifter unit can set an output to a high impedance state. Such an arrangement can allow an output of a level shifter unit to be connected directly to a clocked inverter that receives an output signal from a block operating at a higher voltage level.

A level shifter circuit according to one embodiment can include an input unit for receiving a first signal that can vary between a first voltage source and a second voltage source and a level shifter unit. A level shifter unit can convert a first signal to a level-shifted signal that varies between the first voltage source and a third voltage source. The level shifter circuit can also include a voltage source cut-off means for isolating the level shifter unit from at least one of the first or third voltage sources, and a high impedance setting means for placing an output terminal of the level shifter unit into a high impedance state when the level shifter unit is isolated from the least one of the first or third voltage sources.

According to one aspect of the embodiments, a level shifter unit can include a first transistor of a first conductivity type having a source electrode coupled to a third voltage source, a second transistor of the first conductivity type having a source electrode coupled to the third voltage source, a gate coupled to a drain of the first transistor, and a drain coupled to gate of the first transistor, a third transistor of a second conductivity type having a drain electrode coupled to the drain electrode of the first transistor, and a gate electrode coupled to receive a first signal, and a fourth transistor of the second conductivity type having a drain electrode coupled to the drain electrode of the second transistor, and a gate electrode coupled to receive the first signal. In one particular approach, a first conductivity type can be p-type and a second conductivity type can be n-type.

According to another aspect of the embodiments, a voltage source cut-off means of a level shifter unit can include a fifth transistor of the second conductivity type having a source-drain path coupled between the source of the third transistor and the first voltage source, and a gate coupled to a control terminal that receives an operation mode control signal, and a sixth transistor of the second conductivity type having a source-drain path coupled between the source of the fourth transistor and the first voltage source and a gate coupled to the control terminal.

According to another aspect of the embodiments, a high impedance setting means can include a fifth transistor of the first conductivity type having a source-drain path connected in parallel with a source-drain path of the first transistor. In one particular arrangement, a fifth transistor can have a gate coupled to a control terminal.

According to another aspect of the embodiments, a high impedance setting means of a level shifter unit can include a fifth transistor of the first conductivity type having a source-drain path connected in series between the source of the second transistor and a third voltage source. In one particular arrangement, a control terminal can be coupled to a gate of the fifth transistor by a control signal inverter.

According to another aspect of the embodiments, a level shifter circuit may further include a first inverter operating between the first voltage source and the second voltage source that provides an inverted first signal to the level shifter unit. The level shifter unit can provide a level-shifted signal that is inverted with respect to the first signal. In addition, a second inverter can be provided that operates between the first voltage source and the third voltage source, and that inverts the level-shifted signal to provide an output signal.

According to another aspect of the embodiments, a level shifter circuit may further include a clocked inverter having a data input that receives a second signal that can vary between the first voltage source and the third voltage source, a clock input coupled to receive control signal, and an output node coupled to an output node of the level shifter unit.

The present invention can also include a semiconductor device that includes a first block that operates with a first voltage source, a second block that operates with a second voltage source, a clocked inverter, and a level shifter circuit. The clocked inverter operates with the second voltage source and receives an output signal from the second block, and includes a clocked inverter output. A level shifter circuit can include a level shifting unit for converting a first signal that operates with the first voltage source into a signal that operates with the second voltage source, as well as a level shifter output coupled to the clocked inverter output. The level shifter circuit also includes a power source cut-off means for cutting off power to the level shifter unit during a power-down mode, and a high impedance setting means for placing an output of the level shifting unit into a high impedance state.

According to one aspect of the embodiments, a level shifter unit can include a first transistor of a first conductivity type having a source electrode coupled to the second voltage source, a second transistor of the first conductivity type having a source electrode coupled to the second voltage source, a gate coupled to a drain of the first transistor, and a drain coupled to gate of the first transistor, a third transistor of a second conductivity type having a drain electrode coupled to the drain electrode of the first transistor, and a gate electrode coupled to receive the first signal, and a fourth transistor of the second conductivity type having a drain electrode coupled to the drain electrode of the second transistor, and a gate electrode coupled to receive the first signal. Further, a power source cut-off means can include a fifth transistor of the second conductivity type having a source-drain path coupled between the source of the third transistor and the first voltage source, and a gate coupled to a control terminal that receives an operation mode control signal, and a sixth transistor of the second conductivity type having a source-drain path coupled between the source of the fourth transistor and the first voltage source and a gate coupled to the control terminal.

According to another aspect of the embodiments, a high impedance setting means can include a sixth transistor of the first conductivity type having a source-drain path connected in parallel with a source-drain path of the first transistor.

According to another aspect of the embodiments, a high impedance setting means can include a sixth transistor of the first conductivity type having a source-drain path connected in series between the source of the second transistor and the third voltage source.

According to another aspect of the embodiments, a clocked inverter can include a seventh transistor of the first conductivity type having a source coupled to the second voltage source and a gate coupled to an output signal from a second block, an eighth transistor of the first conductivity type having source coupled to the drain of the seventh transistor, a drain coupled to an output of the level shifter unit, and a gate coupled to a control signal, a ninth transistor of the second conductivity type having a source coupled to a third voltage source, a gate coupled to the output signal from the second block, and a tenth transistor of the second conductivity type having a source coupled to the drain of the ninth transistor, a drain coupled to the output terminal of the level shifting unit, and a gate coupled to a control terminal.

The present invention may also include a semiconductor device that includes a first circuit block that operates with a first voltage source, a second circuit block that operates with a second voltage source, and a level shifter section. A level shifter section can include a first current path between the second voltage source and a third voltage source having an input coupled to a first signal from the first circuit block, and a second current path between the second voltage source and the third voltage source having an input coupled to the first signal. The second current path can have a low impedance between an output node and the second voltage source in a first mode and a high impedance between the output node and the second voltage source in a second mode.

According to one aspect of the embodiments, a level shifter section can include a second current path having an output transistor with a source drain path coupled between an output node and the second voltage source, and an impedance control transistor having a source drain path coupled between the gate of the output transistor and the second voltage source, and a gate coupled to a control signal.

According to another aspect of the embodiments, a level shifter section can include the level shifter section including a second current path having an output transistor with a source drain path coupled between the output node and the second voltage source, and an impedance control transistor having a source drain path coupled between the source of the output transistor and the second voltage source, and a gate coupled to a control signal.

According to another aspect of the embodiments, a semiconductor device can further include an output inverter having a first output current path coupled between the output node and the second voltage source, the first output current path being disabled in a first mode and enabled in the second mode, and a second output current path coupled between the output node and the third voltage source, the second output current path being disabled in the first mode and enabled in the second mode.

According to another aspect of the embodiments, a level shifter section can include a power source cut-off circuit that provides a low impedance between the third voltage source and the first and second current paths in the first mode and a high impedance between the third voltage source and the first and second current paths in the second mode.

DETAILED DESCRIPTION OF THE EMBODIMENTS

The present invention will hereinafter be described in more detail on the basis of various particular embodiments with reference to accompanying figures.

Figure 1:
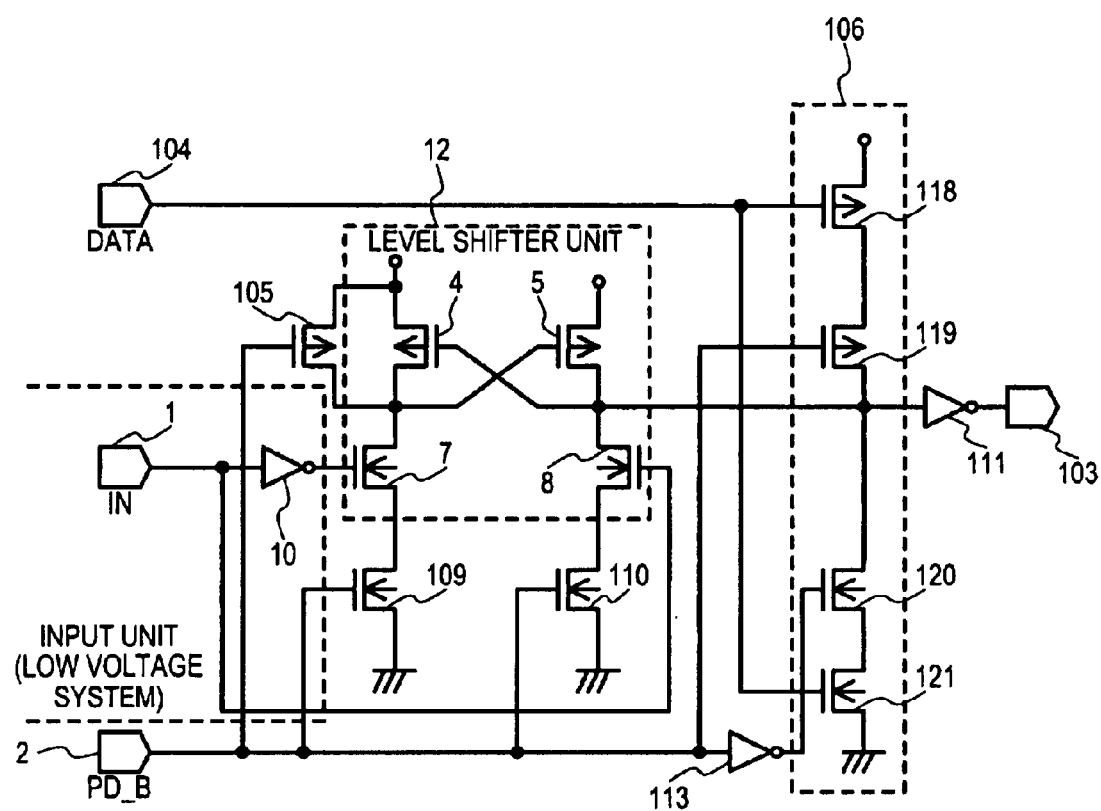
FIG. 1 is a diagram showing a first embodiment of the present invention.

FIG. 1 is a circuit diagram showing a first embodiment of the present invention. The circuit of FIG. 1 can include an input terminal 1 which may receive an output input signal from a first voltage (e.g., low voltage) system, and a control terminal 2. A control terminal 2 can receive a high voltage level when a first voltage power source (e.g., low voltage power source) is in an on state, and can receive a low voltage level (e.g., a ground voltage level) when a first voltage power source is in an off state. A terminal 104 can receive an output signal from a second voltage (e.g., high voltage) system. A terminal 103 can be a common output terminal through which an output signal can be selected from a signal received at input terminal 1 or at input terminal 104.

A signal from circuits operating at a first voltage power source can be input from a terminal 1 into a level shifter unit 12. Such a signal may be input directly, or by way of an inverter 10, as shown in FIG. 1. A level shifter unit 12 can level shift a received input signal to provide an output signal at a second voltage level. Such an output signal can be supplied to an output terminal 103 through an inverter 111. An inverter 111 can operate at the second voltage level. In addition, a signal from a circuit operating at a second voltage power source can be input from a terminal 104, and provided to inverter 111 through a clocked inverter 106. A clocked inverter 106 can include p-type metal-oxide-semiconductor (PMOS) type transistors 118 and 119, and n-type MOS (NMOS) transistors 120 and 121.

A level shifter unit 12 can include PMOS transistors 4 and 5 and NMOS transistors 7 and 8. PMOS transistors 4 and 5 may each have a source electrode connected to a high voltage power source, and gates cross-coupled with their drains. NMOS transistors 7 and 8 having gate electrodes for receiving an output of inverter 10 and a signal at terminal 1, respectively. NMOS transistors 7 and 8 may have drains connected to drains of PMOS transistors 4 and 5, respectively. In such an arrangement, an output signal can be provided at the common drain electrodes of PMOS transistor 5 and NMOS transistor 8.

A first embodiment may further include NMOS transistors 109 and 110 having gate electrodes that can receive a control signal from control terminal 2. NMOS transistor 109 can be connected between a source electrode of NMOS transistor 7 and a low (e.g., ground) potential. Similarly, NMOS transistor 110 can be connected between a source electrode NMOS transistor 8 and a low (e.g., ground) potential.

In operation, when a low voltage power source is in an on state, a high voltage level can be applied at a control terminal 2, and thus to gates of NMOS transistors 109 and 110. NMOS transistors 109 and 110 can be turned on, and a level shifter unit 12 can enter an operational state. In contrast, when a low voltage power source is in an off state, a low voltage level can be applied at a control terminal 2 and NMOS transistors 109 and 110 can be turned off. This can place level shifter unit 12 into a non-operational state, by preventing a current flow there through.

A first embodiment may also include a PMOS transistor 105 having a source-drain path arranged in parallel to that of PMOS transistor 4. PMOS transistor 105 may receive a control signal from control electrode 2. Thus, when a low voltage power source is in an on state, a high voltage is received at control electrode 2 and PMOS transistor 105 can be turned off. In contrast, when a low voltage power source is in an off state, a low voltage is received at control electrode 2 and PMOS transistor 105 can be turned on. With PMOS transistor 105 turned on, a gate of PMOS transistor 5 can be pulled to a high level, thereby turning off PMOS transistor 5.

A level shifter circuit having a power down function according to the embodiment of FIG. 1 can include inverters 10 and 111, level shifter unit 12, NMOS transistors 109 and 110 that control the operational state of the level shifter circuit, and PMOS transistor 105 which is turned on when the level shifter circuit is in the non-operation state to thereby turn off PMOS transistor 5. With PMOS transistor 5 turned off, an output impedance of level shifter unit 12 can be set to a high impedance state.

Next, the operation of the embodiment of FIG. 1 will be described.

When a level shifter circuit of FIG. 1 selects a signal from a low voltage system block, a control terminal 2 can receive a high voltage level. PMOS transistor 105 can be turned off, and NMOS transistors 109 and 110 can be turned on, placing the level shifter unit 12 in the operational state. On the other hand, PMOS transistor 119 and NMOS transistor 120 can be turned off, placing clocked inverter 106 in the non-operational state.

In such an arrangement, if a high signal is input at terminal 1, such a signal can be supplied directly to a gate of NMOS transistor 8 and can be inverted by inverter 10, and applied to a gate of NMOS transistor 7. As a result, a drain potential of NMOS transistor 7 can rise, while a drain potential of NMOS transistor 8 can drop. An output signal level of the level shifter unit 12 can become low by a latching operation of PMOS transistors 4 and 5. The low output signal from level shifter unit 12 can be inverted by inverter 111 to generate a high output signal. In this way, a high signal at a lower operating voltage received at terminal 1 can be level shifted to a high signal at a higher operating voltage.

At this time, because the clocked inverter 106 is electrically disconnected from the output terminal of level shifter unit 12 (e.g., the drain-drain connection of NMOS transistor 8 and PMOS transistor 5) due to NMOS transistor 120 and PMOS transistor 119 being turned off, the signal from the high voltage system block that can be input through terminal 104 has essentially no effect on the clocked inverter 106.

When a level shifter circuit of FIG. 1 selects a signal from a high voltage system block, a control terminal 2 can receive a low voltage level (e.g., a ground potential). PMOS transistor 105 can be turned on, and NMOS transistors 109 and 110 can be turned off, placing the level shifter unit 12 in the non-operational state. On the other hand, because PMOS transistor 119 and NMOS transistor 120 can be turned on, clocked inverter 106 is placed in the operational state.

In such an arrangement, if a high signal is input at terminal 104, such a signal can be inverted by clocked inverter 106 to provide a low input to inverter 111. Inverter 111 inverts such an input to generate a high output signal at terminal 103. In this way, a high signal at a high operating voltage received at terminal 104 can output at a high operating voltage level at terminal 103.

At this time, an output terminal of level shifter unit 12 can be connected to the output terminal of the clocked inverter 106. However, as noted above, level shifter unit 12 can be in a non-operational state, and PMOS transistor 5, connected directly to the output terminal of level shifter unit 12 is turned off. In addition, NMOS transistor 110 connected in serried to NMOS transistor 8 is also turned off. Thus, an output impedance of level shifter unit 12 can become high, and level shifter unit 12 will exert essentially no influence on a signal from a high voltage system clock that is output from clocked inverter 106.

Figure 7:
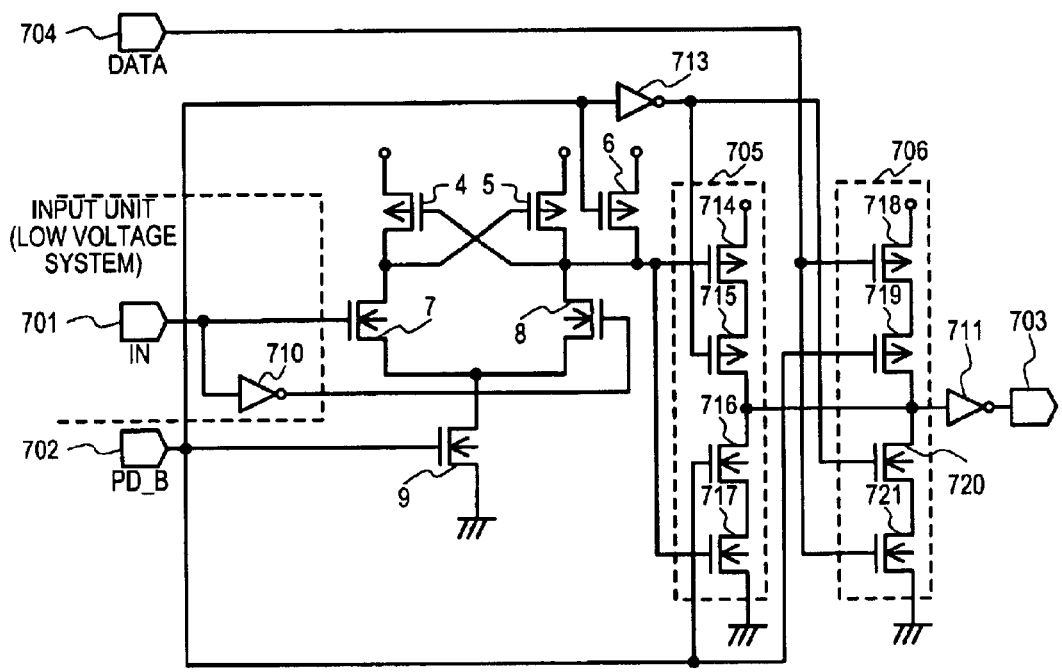
FIG. 7 is a schematic diagram of an I/O buffer that includes a level shifter circuit like that of FIG. 3.

The embodiment of FIG. 1 may advantageously reduce a size of a level shifter circuit as compared to conventional approaches. The level shifter circuit of FIG. 1 includes NMOS transistors 109 and 110 at the sources of NMOS transistors 7 and 8, respectively, thereby adding a transistor over a conventional approach. However, the arrangement of FIG. 1 does not need a clocked inverter (e.g., 705 in FIG. 7) to isolate the output of a level shifter unit 12. Consequently, the overall transistor count for the circuit can be reduced by three, as compared to conventional approaches. As a result, circuit area, and hence manufacturing cost, can be reduced.

Figure 2:
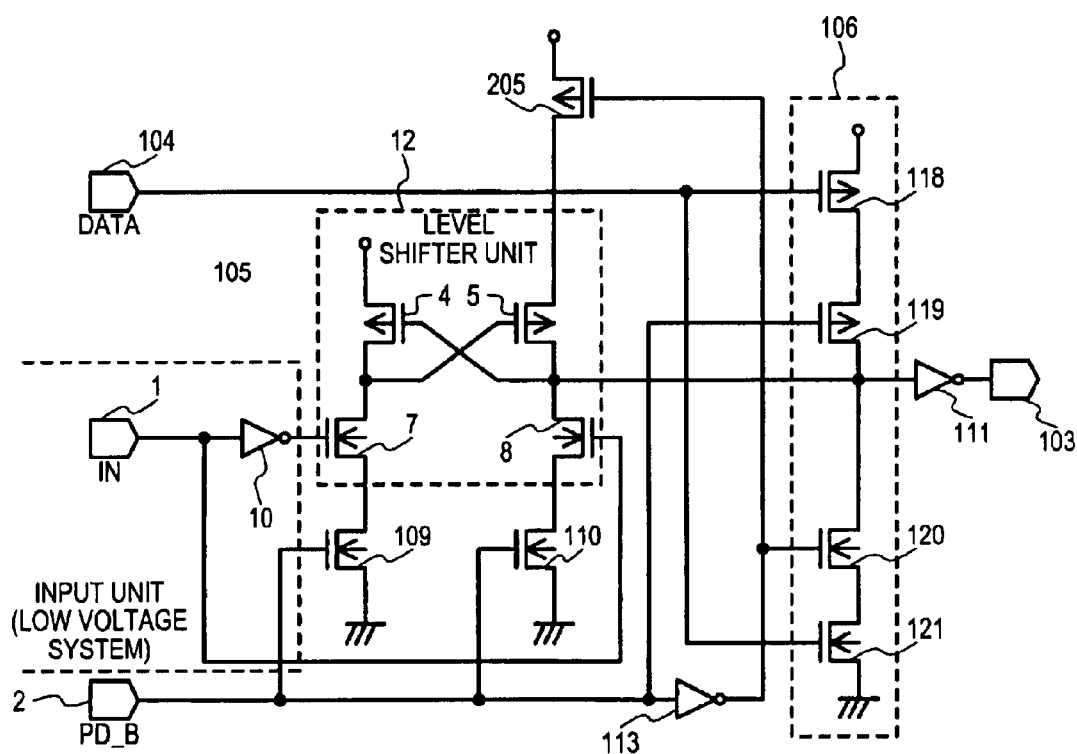
FIG. 2 is a diagram showing a second embodiment of the present invention.
Figure 3:
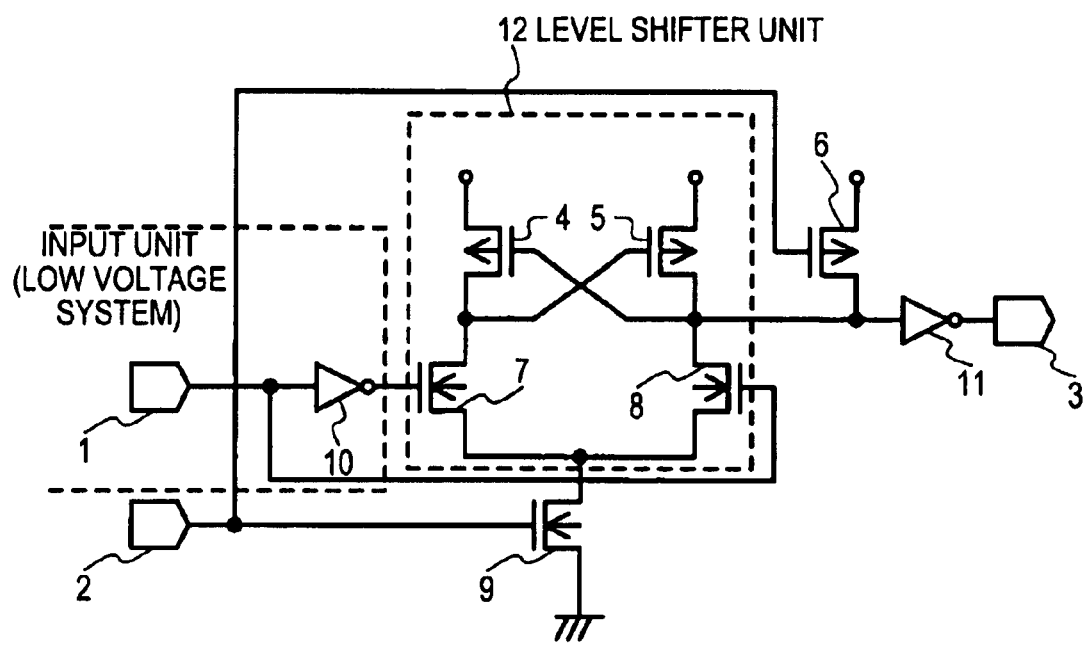
FIG. 3 is a diagram showing a conventional level shifter circuit with a power-down function.
Figure 4:
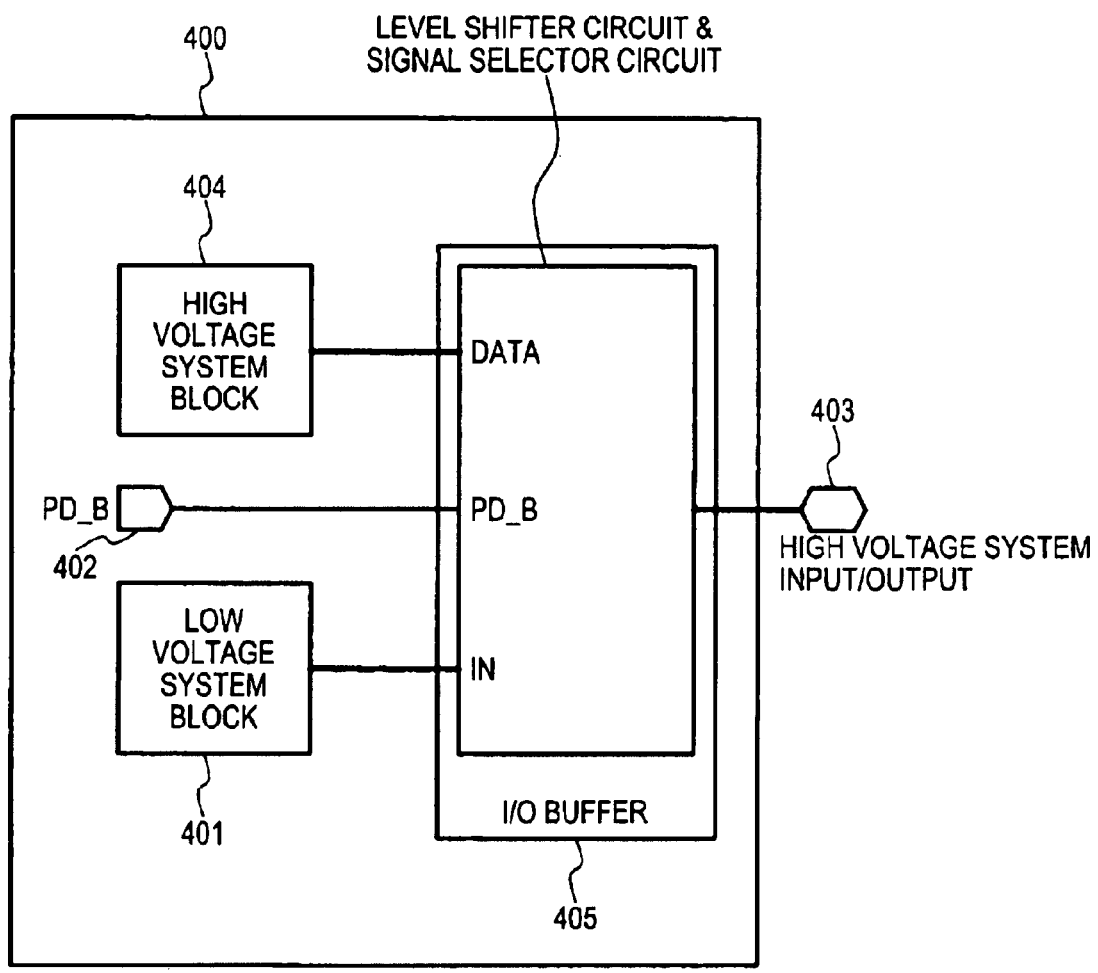
FIG. 4 is a diagram of a large scale integrated circuit (LSI) to which the present invention can be applied.
Figure 5:
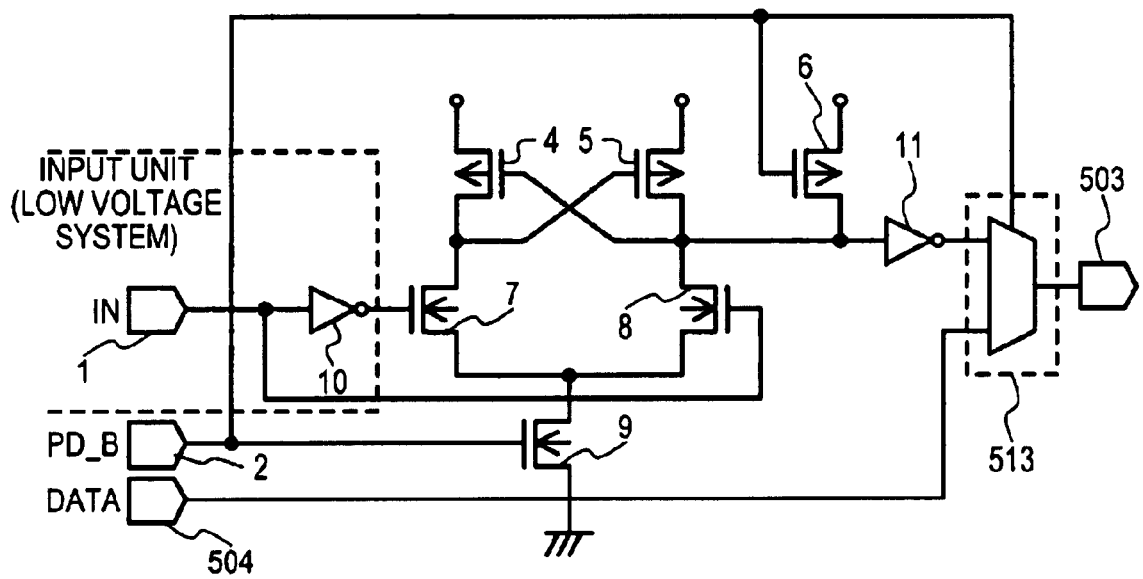
FIG. 5 is a schematic diagram of an input/output (I/O) buffer that includes a level shifter circuit like that of FIG. 3.
Figure 6:
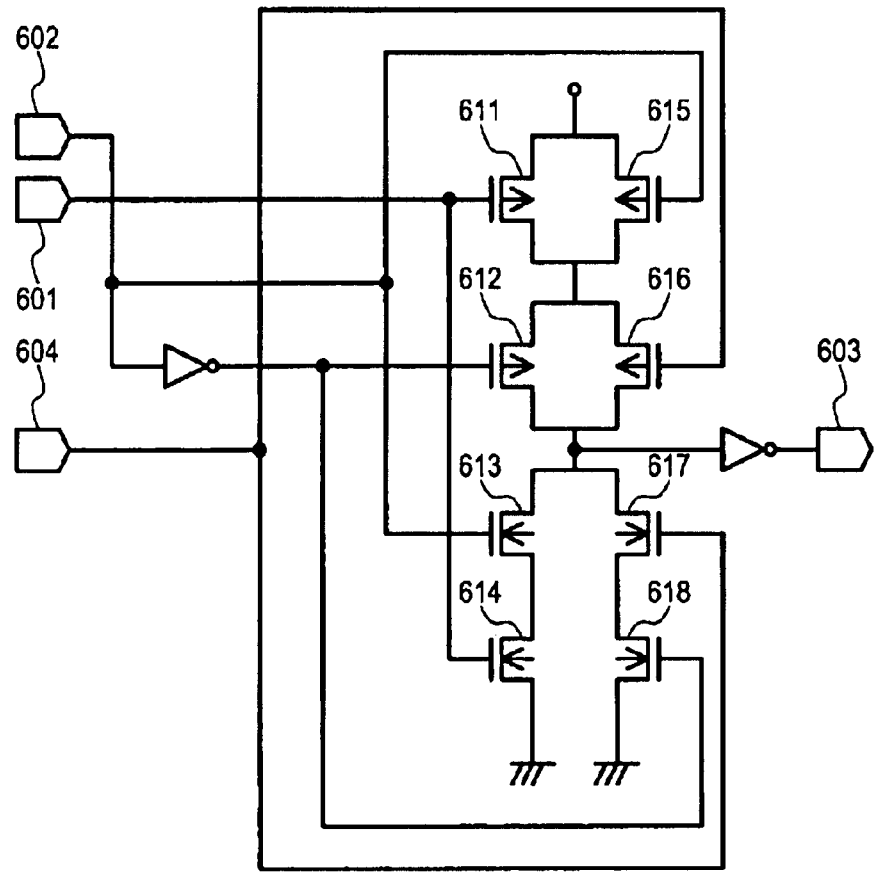
FIG. 6 is a schematic diagram showing the general configuration of a conventional selector circuit.
Figure 6:
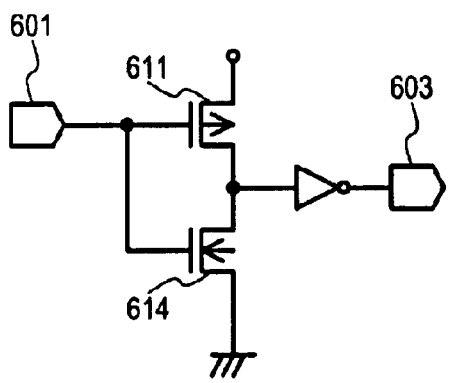
Figure 6:
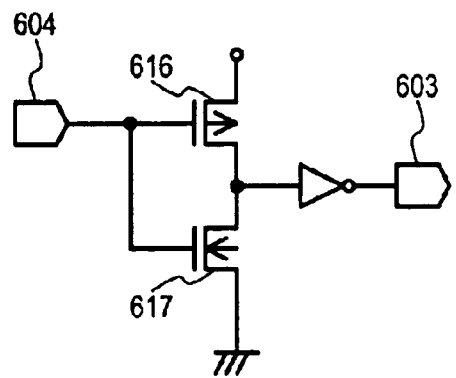

FIG. 2 is a circuit diagram of a second embodiment of the present invention. A feature of this embodiment can be that a level shifter circuit includes a PMOS transistor 205 but does not include PMOS transistor 105. PMOS transistor 205 can be connected in series between a source electrode of PMOS transistor 5 and a high voltage power source. When a low voltage power source is in an on-state, a low voltage signal can be supplied to a gate of PMOS transistor 205, turning PMOS transistor 205 on. When a low voltage power source is in an off-state, a high voltage signal can be supplied to a gate of PMOS transistor 205, turning PMOS transistor 205 off. Other circuit sections of a second embodiment can be essentially the same as that of the first embodiment.

The operation of the second embodiment of FIG. 2 will now be described.

When a level shifter circuit of FIG. 1 selects a signal from a low voltage system block, a control terminal 2 can receive a high voltage level. Such a high level signal can be inverted by inverter 113 and supplied to a gate of PMOS transistor 205. PMOS transistor 205 and NMOS transistors 109 and 110 can all be turned on, placing the level shifter unit 12 in the operational state. On the other hand, PMOS transistor 119 and NMOS transistor 120 can be turned off, placing clocked inverter 106 in the non-operational state.

In such an arrangement, if a high signal is input at terminal 1, such a signal can supplied directly to a gate of NMOS transistor 8 and can be inverted by inverter 10, and applied to a gate of NMOS transistor 7. As a result, a drain potential of NMOS transistor 7 can rise, while a drain potential of NMOS transistor 8 can drop. An output signal level of the level shifter unit 12 can become low by a latching operation of PMOS transistors 4 and 5. The low output signal from level shifter unit 12 can be inverted by inverter 111 to generate a high output signal. In this way, a high signal at a lower operating voltage received at terminal 1 can be level shifted to a high signal at a higher operating voltage.

At this time, because the clocked inverter 106 is electrically disconnected from the output terminal of level shifter unit 12 due to NMOS transistor 120 and PMOS transistor 119 being turned off, the signal from the high voltage system block that can be input through terminal 104 has essentially no effect on the clocked inverter 106.

When a level shifter circuit of FIG. 1 selects a signal from a high voltage system block, a control terminal 2 can receive a low voltage level (e.g., a ground potential). PMOS transistor 205 and NMOS transistors 109 and 110 can be turned off, placing the level shifter unit 12 in the non-operational state. On the other hand, because PMOS transistor 119 and NMOS transistor 120 can be turned on, clocked inverter 106 is placed in the operational state.

In such an arrangement, if a high signal is input at terminal 104, such a signal can be inverted by clocked inverter 106 to provide a low input to inverter 111. Inverter 111 inverts such an input to generate a high output signal at terminal 103. In this way a high level signal at a high operating voltage received at terminal 104 can output at a high operating voltage level at terminal 103.

At this time, an output terminal of level shifter unit 12 can be connected to the output terminal of the clocked inverter 106. However, level shifter unit 12 can be in a non-operational state. Further, PMOS transistor 205 connected in series with PMOS transistor 5 can be turned off, and NMOS transistor 110 connected in series to NMOS transistor 8 can be turned off. Thus, an output impedance of level shifter unit 12 can become high, and level shifter unit 12 will exert essentially no influence on a signal from a high voltage system clock that is output from clocked inverter 106.

In the second embodiment of FIG. 2, PMOS transistor 205 is arranged in series with PMOS transistor 5. As will be recalled, to increase drive capability, a PMOS transistor 5 can have an increased channel width. Thus, a PMOS transistor 205 may also have an increased channel width. Such an additional transistor of increased channel width (205) can contribute to overall size of a level shifting circuit. However, like the first embodiment, the arrangement of FIG. 2 does not need a clocked inverter (e.g., 705 in FIG. 7) to isolate the output of a level shifter unit 12. Consequently, the overall transistor count for the circuit can be reduced by three, as compared to conventional approaches. This can reduce circuit area and hence manufacturing cost.

According to the present invention, a circuit configuration can output signals from circuit blocks operating at different power source systems at a common terminal by mode switching. In such a circuit configuration, a level shifter unit can be included that converts the level of an output signal from a low voltage power source level to that of a high voltage power source level. The output of the level shifter unit can be placed in a high impedance state when the level shifter unit is in a non-operational state. Consequently, it can be possible to omit a means for setting a selector circuit output to a high impedance state when a selector circuit is connected to the level shifter unit. This can reduce overall circuit area and/or circuit cost as compared to conventional approaches.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A level shifter circuit, comprising:
   an input unit for receiving a first signal that varies between a first voltage source and a second voltage source; and
   a level shifter unit for converting the first signal to a level-shifted signal that varies between the first voltage source and a third voltage source, the level shifter unit including
      a first transistor of a first conductivity type having a source electrode coupled to the third voltage source,
      a second transistor of the first conductivity type having a source electrode coupled to the third voltage source, a gate coupled to a drain of the first transistor, and a drain coupled to a gate of the first transistor and wherein the drain of the second transistor is an output terminal of the level shifter unit for providing the level-shifted signal,
      a voltage source cut-off circuit that isolates the level shifter unit from the first voltage source, and
      a high impedance setting circuit that places the output terminal of the level shifter unit into a high impedance state when the level shifter unit is isolated from the first voltage source.

2. The level shifter circuit of claim 1, wherein:
   the level shifter unit further includes
      a third transistor of a second conductivity type having a drain electrode coupled to the drain electrode of the first transistor, and a gate electrode coupled to receive the first signal, and
      a fourth transistor of the second conductivity type having a drain electrode coupled to the drain electrode of the second transistor, and a gate electrode coupled to receive the first signal.

3. The level shifter circuit of claim 2, wherein:
   the first conductivity type is p-type and the second conductivity type is n-type.

4. The level shifter circuit of claim 2, wherein:
   the voltage source cut-off circuit includes
      a fifth transistor of the second conductivity type having a source-drain path coupled between the source of the third transistor and the first voltage source, and a gate coupled to a control terminal that receives an operation mode control signal, and
      a sixth transistor of the second conductivity type having a source-drain path coupled between the source of the fourth transistor and the first voltage source and a gate coupled to the control terminal.

5. The level shifter circuit of claim 2, wherein:
   the high impedance setting circuit includes a fifth transistor of the first conductivity type having a source-drain path connected in parallel with a source-drain path of the first transistor.

6. The level shifter circuit of claim 5, wherein:
   the fifth transistor has a gate coupled to a control terminal that receives an operation mode control signal.

7. The level shifter circuit of claim 2, wherein:
   the high impedance setting circuit includes a fifth transistor of the first conductivity type having a source-drain path connected between the source of the second transistor and the third voltage source.

8. The level shifter circuit of claim 7, further including:
a control terminal that receives an operation mode control signal, and
the control terminal is coupled to a gate of the fifth transistor by a control signal inverter that inverts the operation mode control signal.

9. The level shifter circuit of claim 2, further including:
a first inverter operating between the first voltage source and the second voltage source that provides an inverted first signal to the level shifter unit;
wherein the level-shifted signal is the logical inversion of the first signal; and
a second inverter operating between the first voltage source and the third voltage source that inverts the level-shifted signal to provide an output signal.

10. The level shifter circuit of claim 1, further including:
a clocked inverter having
    a data input that receives a second signal that varies between the first voltage source and the third voltage source,
    a clock input coupled to receive an operation mode control signal, and
    an output node coupled to the output terminal of the level shifter unit.

11. A semiconductor device, comprising:
a first block that operates with a first voltage source;
a second block that operates with a second voltage source;
a clocked inverter, that operates with the second voltage source, for receiving an output signal from the second block, the clocked inverter including a clocked inverter output; and
a level shifter circuit that includes
a level shifter unit for converting a first signal from the first block that operates with the first voltage source into a level-shifted signal that operates with the second voltage source, the level shifter unit having a level shift output coupled to the clocked inverter output,
a power source cut-off circuit that cuts off power to the level shifter unit during a power-down mode, and
a high impedance setting circuit that places an output terminal of the level shifter unit into a high impedance state during the power mode, wherein
the level shifter unit includes
    a first transistor of a first conductivity type having a source electrode coupled to the second voltage source,
    a second transistor of the first conductivity type having a source electrode coupled to the second voltage source, a gate coupled to a drain of the first transistor, and a drain coupled to a gate of the first transistor and wherein the drain of the second transistor is the output terminal of the level shifter unit that provides the level-shifted signal.

12. The semiconductor device of claim 11, wherein:
the level shifter unit further includes
    a third transistor of a second conductivity type having a drain electrode coupled to the drain electrode of the first transistor, and a gate electrode coupled to receive the first signal, and
    a fourth transistor of the second conductivity type having a drain electrode coupled to the drain electrode of the second transistor, and a gate electrode coupled to receive the first signal; and
the power source cut-off circuit includes a fifth transistor of the second conductivity type having a source-drain path coupled between the source of the third transistor and a third voltage source, and a gate coupled to a control terminal that receives an operation mode control signal, and
a sixth transistor of the second conductivity type having a source-drain path coupled between the source of the fourth transistor and the third voltage source, and a gate coupled to the control terminal.

13. The semiconductor device of claim 12, wherein:
the high impedance setting circuit includes a seventh transistor of the first conductivity type having a source-drain path connected in parallel with a source-drain path of the first transistor.

14. The semiconductor device of claim 12, wherein:
high impedance setting circuit includes a seventh transistor of the first conductivity type having a source-drain path connected between the source of the second transistor and the second voltage source.

15. The semiconductor device of claim 12, wherein:
the clocked inverter includes
    a seventh transistor of the first conductivity type having a source coupled to the second voltage source and a gate coupled to an output signal from the second block,
    an eighth transistor of the first conductivity type having source coupled to the drain of the seventh transistor, a drain coupled to an output of the level shifter unit, and a gate coupled to the control terminal,
    a ninth transistor of the second conductivity type having a source coupled to the third voltage source, a gate coupled to the output signal from the second block, and
    a tenth transistor of the second conductivity type having a source coupled to the drain of the ninth transistor, a drain coupled to the output terminal of the level shifting unit, and a gate coupled to the control terminal.

16. A semiconductor device, comprising:
a first voltage source that operates a first circuit block and a second
a level shifter section that is enabled in a first mode and disabled in a second mode and having
    a first current path coupled between the second voltage source and a third voltage source having an input coupled to a first signal from the first circuit block,
    a second current path coupled between the second voltage source and the third voltage source having an input coupled to the first signal, the second current path having a high impedance between an output node of the level shifter section and the second voltage source in the second mode irrespective of a value of the first signal,
    wherein a first transistor of a first conductivity type included in the first current path and having a source electrode coupled to the second voltage source, and
    wherein an output transistor of the first conductivity type included in the second current path and having a source electrode coupled to the second voltage source, a gate coupled to a drain of the first transistor, and a drain coupled to a gate of the first transistor and wherein the drain of the output transistor is the output node of the level shifter section.

17. The semiconductor device of claim 16, wherein:
the level shifter section further includes an impedance control transistor having a source drain path coupled between the gate of the output transistor and the second voltage source, and a gate coupled to a control signal.

18. The semiconductor device of claim 16, wherein:
the level shifter section further includes an impedance control transistor having a source drain path coupled between the source of the output transistor and the second voltage source, and a gate coupled to a control signal.

19. The semiconductor device of claim 16, further including:
an output inverter having
a first output current path coupled between the output node and the second voltage source, the first output current path being disabled in the first mode and enabled in the second mode, and
a second output current path coupled between the output node and the third voltage source, the second output current path being disabled in the first mode and enabled in the second mode.

20. The semiconductor device of claim 16, wherein:
the level shifter section further includes
a power source cut-off circuit that provides a low impedance between the third voltage source and the first and second current paths in the first mode and a high impedance between the third voltage source and the first and second current paths in the second mode.

\* \* \* \* \*